United States Patent
Zhou et al.

(10) Patent No.: US 11,889,666 B2
(45) Date of Patent: Jan. 30, 2024

(54) POWER DEVICE ASSEMBLIES HAVING EMBEDDED PCBS AND METHODS OF FABRICATING THE SAME

(71) Applicant: Toyota Motor Engineering & Manufacturing North America, Inc., Plano, TX (US)

(72) Inventors: Feng Zhou, Ann Arbor, MI (US); Yanghe Liu, Ann Arbor, MI (US); Hiroshi Ukegawa, South Lyon, MI (US)

(73) Assignee: TOYOTA MOTOR ENGINEERING & MANUFACTURING NORTH AMERICA, INC., Plano, TX (US)

( * ) Notice: Subject to any disclaimer, the term of this patent is extended or adjusted under 35 U.S.C. 154(b) by 282 days.

(21) Appl. No.: 17/518,300

(22) Filed: Nov. 3, 2021

(65) Prior Publication Data
US 2023/0139202 A1    May 4, 2023

(51) Int. Cl.
H05K 7/20        (2006.01)

(52) U.S. Cl.
CPC ....... *H05K 7/20927* (2013.01); *H05K 7/2039* (2013.01); *H05K 7/20254* (2013.01)

(58) Field of Classification Search
CPC ............. H01L 21/4882; H01L 21/4871; H01L 23/3735; H01L 23/373; H01L 23/473; H05K 7/20927; H05K 7/2039; H05K 1/0272; H05K 1/0203; H05K 7/20254; H05K 1/0209; H05K 1/0204; H05K 7/20272; H05K 7/20509
See application file for complete search history.

(56) References Cited

U.S. PATENT DOCUMENTS

| | | | |
|---|---|---|---|
| 7,190,581 B1 | 3/2007 | Hassani et al. | |
| 7,499,258 B2 | 3/2009 | Shim et al. | |
| 10,006,720 B2 | 6/2018 | Bhunia et al. | |
| 2003/0133319 A1* | 7/2003 | Radosevich | H02M 7/003 363/141 |
| 2010/0002397 A1* | 1/2010 | Toh | H01L 23/473 361/713 |

(Continued)

FOREIGN PATENT DOCUMENTS

| | | |
|---|---|---|
| DE | 102011006061 A1 | 9/2012 |
| EP | 3745591 A1 | 12/2020 |
| WO | 2020210579 A1 | 10/2020 |

*Primary Examiner* — Adam B Dravininkas
(74) *Attorney, Agent, or Firm* — DINSMORE & SHOHL LLP (57) ABSTRACT

Disclosed herein are apparatus and methods for a power electronics assembly includes a cold plate assembly and one or more power device assemblies. The cold plate assembly includes a manifold including a heat sink cavity in a first surface and a heat sink. The heat sink includes one or more substrate cavities and the heat sink is positioned in the heat sink cavity. The one or more power device assemblies are positioned within the one or more substrate cavities. Each power device assembly of the one or more power assemblies includes a direct bonded metal (DBM) substrate including a first metal layer directly bonded to an insulator layer and a power device. The DBM substrate includes a power device cavity. The power device is positioned in the power device cavity and the power device is electronically coupled to the first metal layer.

20 Claims, 12 Drawing Sheets

(56) References Cited

U.S. PATENT DOCUMENTS

| | | | |
|---|---|---|---|
| 2011/0031608 A1* | 2/2011 | Kim | H01L 23/142 |
| | | | 257/692 |
| 2012/0236500 A1* | 9/2012 | Higuchi | H01L 23/473 |
| | | | 361/699 |
| 2013/0113074 A1* | 5/2013 | Ebersberger | H01G 2/106 |
| | | | 257/532 |
| 2014/0138075 A1* | 5/2014 | Yang | H01L 23/473 |
| | | | 165/185 |
| 2014/0167248 A1* | 6/2014 | Delgado | H01L 23/13 |
| | | | 257/713 |
| 2019/0371622 A1 | 12/2019 | Friedbald | |
| 2020/0294883 A1* | 9/2020 | Dede | H01L 23/3107 |

\* cited by examiner

POWER DEVICE ASSEMBLIES HAVING EMBEDDED PCBS AND METHODS OF FABRICATING THE SAME

TECHNICAL FIELD

The present specification generally relates to apparatus and methods for power electronic assemblies and, more specifically, apparatus and methods for power electronic assemblies having low overall thermal resistance while achieving a compact package size.

BACKGROUND

Due to the increased use of electronics in vehicles, there is a need to make electronic systems more compact. One component of these electronic systems is a power electronic device used as a switch in an inverter. Power electronic devices have large cooling requirements due to the heat generated.

Additionally, there has been a trend for power electronic devices conventionally composed of silicon to now be composed of silicon-carbide. The use of silicon-carbide causes a larger heat flux due to it defining a smaller device footprint. For these reasons, and more, there is a need to improve the cooling of power electronic devices while maintaining a compact package size.

SUMMARY

In one embodiment, an apparatus for a power electronics assembly includes a cold plate assembly and one or more power device assemblies. The cold plate assembly includes a manifold including a heat sink cavity in a first surface and a heat sink. The heat sink includes one or more substrate cavities and the heat sink is positioned in the heat sink cavity. The one or more power device assemblies are positioned within the one or more substrate cavities. Each power device assembly of the one or more power assemblies includes a direct bonded metal (DBM) substrate including a first metal layer directly bonded to an insulator layer and a power device. The DBM substrate includes a power device cavity. The power device is positioned in the power device cavity and the power device is electronically coupled to the first metal layer.

In another embodiment, a power device assembly includes a direct bonded metal (DBM) substrate and one or more power devices. The DBM substrate includes a first metal layer directly bonded to an insulator layer and the DBM substrate includes one or more power device cavities. The one or more power devices are each positioned in one of the one or more power device cavities. Each of the one or more power devices are electrically coupled to the first metal layer.

In yet another embodiment, a method of forming a power electronics assembly is shown. The method includes positioning a heat sink into a heat sink cavity on a first surface of a cold plate manifold. The heat sink includes one or more substrate cavities. The method further includes embedding one or more power device assemblies within the one or more substrate cavities. Each power device assembly includes a direct bonded metal (DBM) substrate having a first metal layer bonded to an insulator layer. The DBM substrate includes a power device cavity. The method further includes placing a bonding layer at least partially within the power device cavity. The method further includes bonding a power device to the power device cavity via the bonding layer. The power device being electrically coupled to the first metal layer.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Embodiments described herein are generally directed to power electronics assemblies having direct bonded metal (DBM) layers integrated with conductive layers and cold plate assemblies having self-alignment features. The conductive layer has a cavity where a power electronics device is placed. The cavity is designed so that the top surface of the power electronics device is flush with a top surface of the cold plate assembly, while allowing the power electronics device to be electrically coupled to its bottom electrode. The flat surface allows for PCBs to be printed directly upon the cold plate assembly. Since there are less overall layers there is less overall thermal resistance in the power electronics assembly. Additionally, due to the proximity of the heat-generating power electronics device to the cold plate, there is improved cooling. This allows for the power electronics device to output higher power, while maintaining a compact package size.

In conventional systems, separate metal components are needed to electrically couple a power electronics device for a power electronics assembly to a bottom electrode of the power electronics device. This results in additional components, increased height of the assembly, and increased thermal resistance.

Various embodiments of the power electronics assemblies, method of fabricating power electronic assemblies, and operation of power electronic assemblies are described in more detail herein. Whenever possible, the same reference numerals will be used throughout the drawings to refer to the same or like parts.

Figure 1:
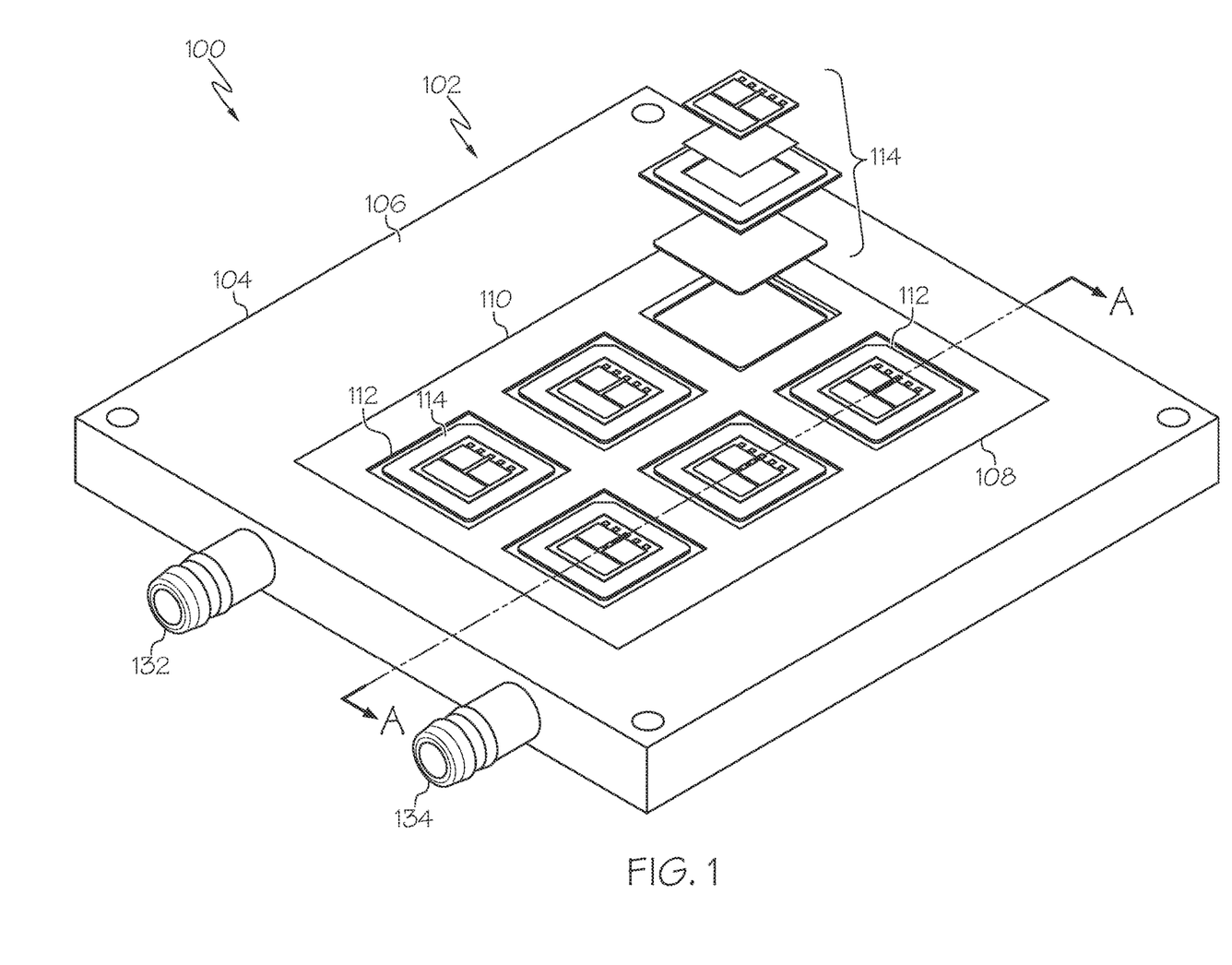
FIG. 1 schematically depicts a perspective view of an illustrative power electronics assembly including a plurality of embedded power devices, according to one or more embodiments shown and described herein.
Figure 2:
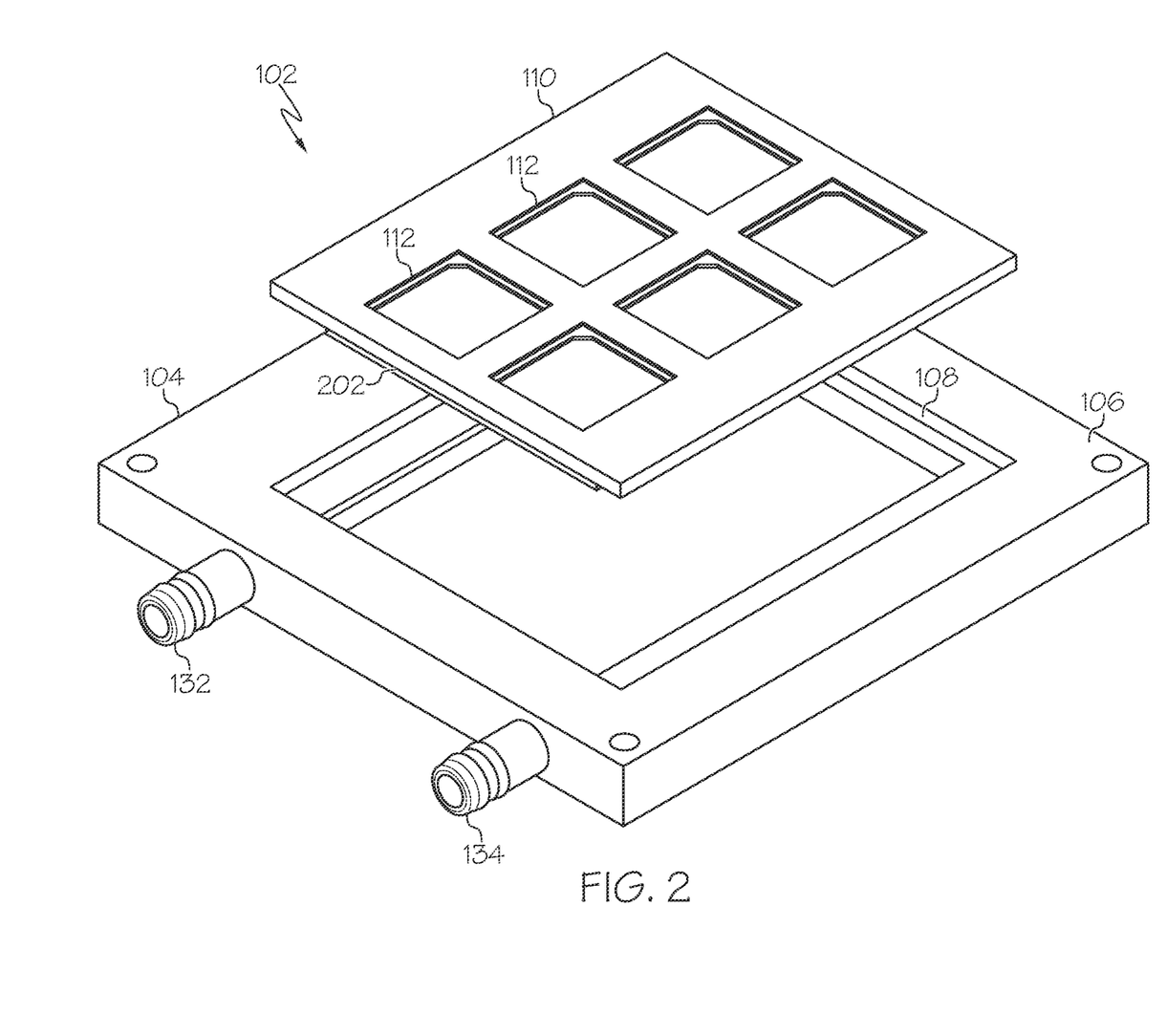
FIG. 2 schematically depicts an exploded perspective view of a cold plate assembly of the power electronics assembly having a heat sink and a manifold, according to one or more embodiments shown and described herein.
Figure 3:
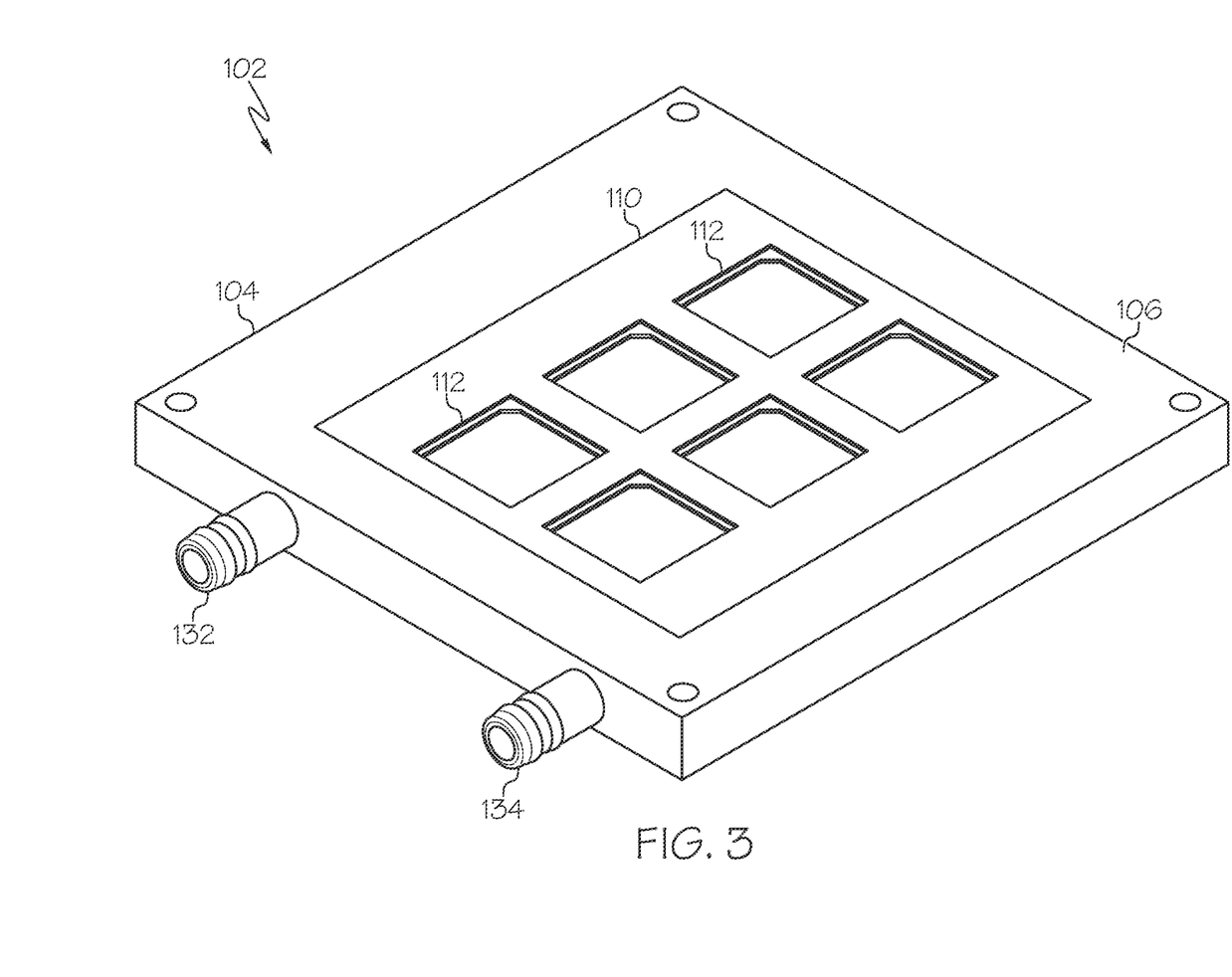
FIG. 3 schematically depicts an assembled perspective view of a cold plate assembly of a power electronics assembly, according to one or more embodiments shown and described herein.

Referring now to FIGS. 1-3, an example power electronics assembly 100 is illustrated according to one or more embodiments described herein. Particularly, FIG. 1 depicts a power electronics assembly 100 including a plurality of power device assemblies 114 with one power device assembly shown in an exploded view. FIG. 2 illustrates a cold plate assembly 102 of the power electronics assembly 100 in an exploded view. FIG. 3 illustrates the cold plate assembly 102 of FIG. 2 in an assembled view.

In some embodiments, the power electronics assembly 100 is utilized in an electric vehicle. In other embodiments, the power electronics assembly 100 is used in an electrically-driven device, such as and without being limited to, a hybrid vehicle, any electric motor, generators, industrial tools, household appliances, and the like. The power electronics assembly 100 may be electrically coupled to an electric motor and/or a battery and is configured to receive power from the electric motor and/or battery.

The example power electronics assembly 100 includes a cold plate assembly 102 configured to house embedded power devices 114, while absorbing the heat generated by the power devices 114. As discussed in greater detail herein, the cold plate assembly 102 receives coolant configured to absorb the heat generated by the power devices 114 and provide that coolant to a downstream cooling system. In this way, the cold plate assembly 102 is able to remove heat from the power electronics assembly 100 in an efficient manner. The cold plate assembly 102 may be machined, forged, extruded, or cast from a block of thermally conductive material. In some embodiments, the cold plate assembly 102 is 3D printed.

The cold plate assembly 102 includes a manifold 104 (e.g., a manifold plate). The manifold 104 is configured to receive and provide coolant to remove heat from the power electronics assembly 100. The manifold 104 has a first surface 106 (e.g., plane). The first surface 106 defines a substantially flat profile. As discussed in greater detail herein, a PCB may be printed upon the first surface 106. This is advantageous as it reduces the thermal resistance of the power electronics assembly 100.

The manifold 104 includes an inlet 132 (e.g., input port). The inlet 132 is configured to receive coolant from a cooling system (not shown). After interfacing with the heat sink 110, the coolant is configured to receive heat from the heat sink 110. The cold plate assembly 102 further includes an outlet 134 (e.g., output port). The warmed coolant exits the cold plate assembly 102 via the outlet 134. In this way, the cold plate assembly 102 is able to cool the power electronics assembly 100.

The manifold 104 defines a heat sink cavity 108 (see FIG. 2) in the first surface 106. The cold plate assembly 102 further includes a heat sink 110. The heat sink 110 is positioned within the heat sink cavity 108, as shown in FIGS. 1 and 3. Due to the heat sink 110 being positioned in the heat sink cavity 108, elements of the heat sink 110 are self-aligned relative to the cold-plate assembly 102. In other words, the position of the heat sink 110 is known by fixing the heat sink 110 to a specified position. This reduces the overall assembly tolerances of the power electronics assembly 100.

The heat sink 110 includes a plurality of substrate cavities 112. As discussed in greater detail herein, each of the plurality of substrate cavities 112 defines a depth large enough that when components are placed into each of the plurality of substrate cavities 112, a top surface of each of the plurality of substrate cavities 112 is flush (e.g., flat, along the same plane) with the first surface 106. This is advantageous as it provides a flush surface for the PCB to be printed upon the power electronics assembly 100.

Figure 4:
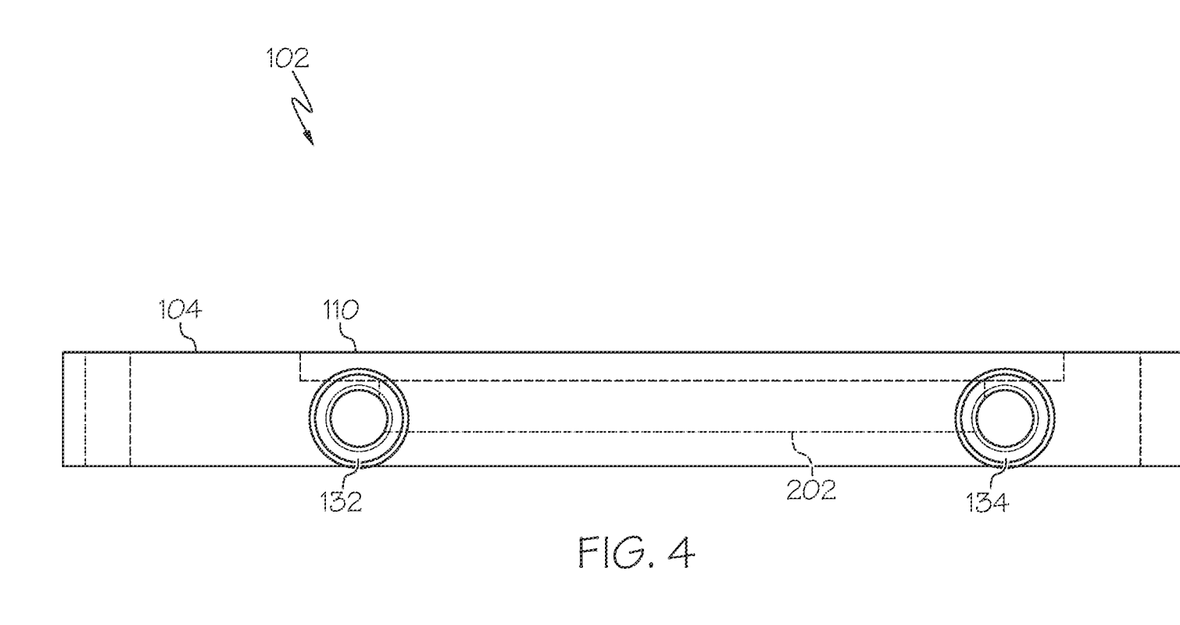
FIG. 4 schematically depicts a side view of a cold plate assembly of a power electronics assembly, according to one or more embodiments shown and described herein.

Referring now to FIG. 4, a side view of the example cold plate assembly is shown. In some embodiments, the cold plate assembly 102 includes fins 202. The fins 202 are positioned on a bottom surface of the heat sink 110. The fins 202 are further positioned between the inlet 132 and the outlet 804. Additionally, the fins 202 are positioned fluidly downstream of the inlet 132 and fluidly upstream of the outlet 134. This results in the fins 202 disrupting the coolant flow before exiting the outlet 134. In this way, coolant entering the inlet 132 has maximum contact with the fins 202 in order to increase the effectiveness of cooling the cold plate assembly 102. The fins 202 includes a series of channels. In some embodiments, the fins 202 include pin fins or any other suitable type of fins. After entering the inlet 132, the coolant flows through the channels of the fins 202 in order to increase the effectiveness of cooling the cold plate assembly 102.

Figure 5:
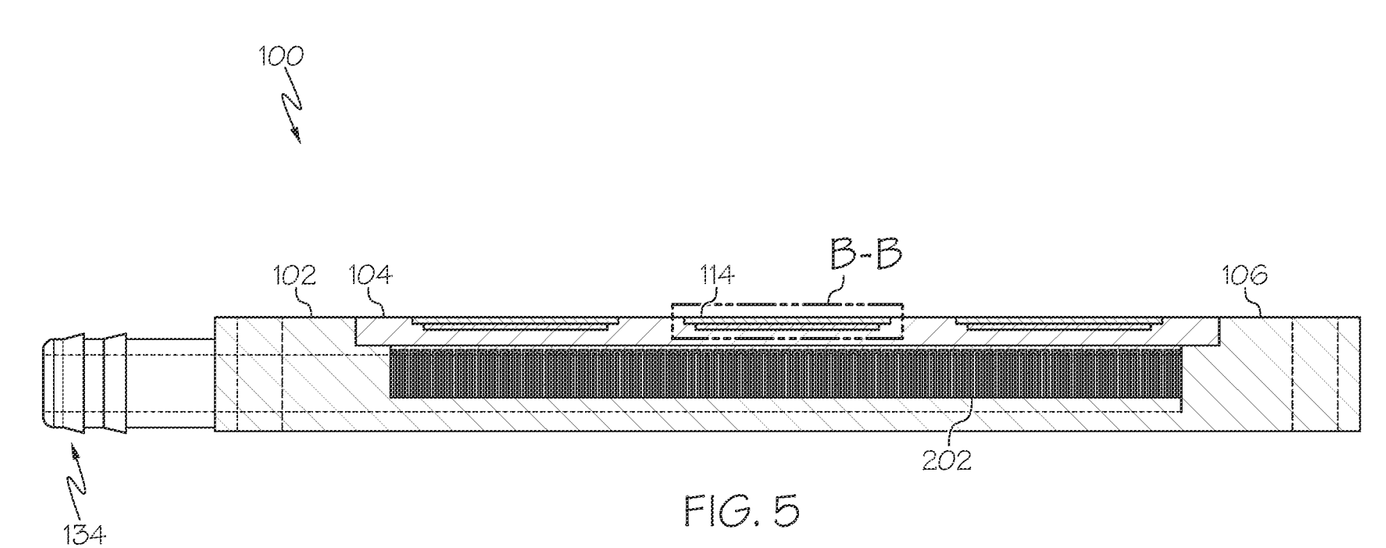
FIG. 5 schematically depicts a side view of the power electronics assembly of FIG. 1, taken along cross-section A-A of FIG. 1.

Referring now to FIG. 5, a side view of the power electronics assembly of FIG. 1, taken along cross-section A-A of FIG. 1, is shown. As illustrated, the top surfaces of the heat sink 110, the substrate cavity 112, and the power device assembly 114 are flush to the first surface 106 of the manifold 104.

Figure 6:
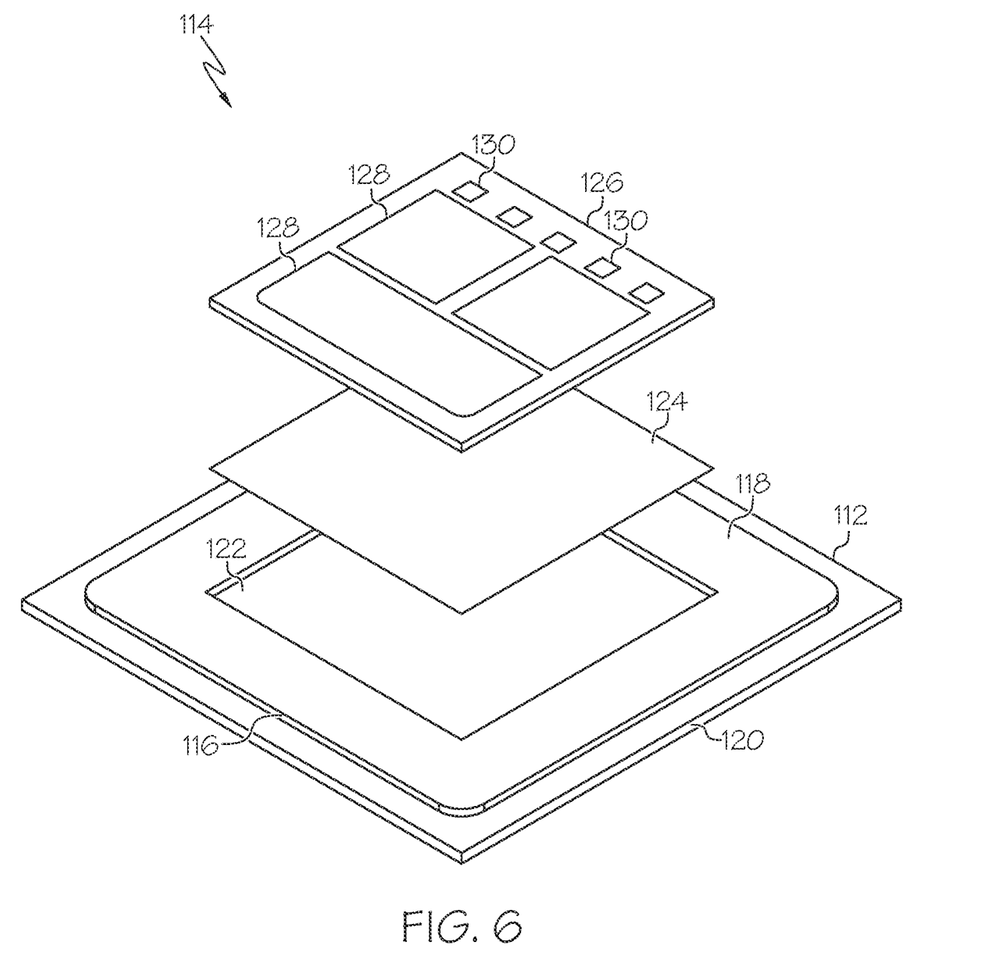
FIG. 6 schematically depicts an exploded, perspective view of one of the plurality of embedded power device assemblies, according to one or more embodiments shown and described herein.
Figure 7:
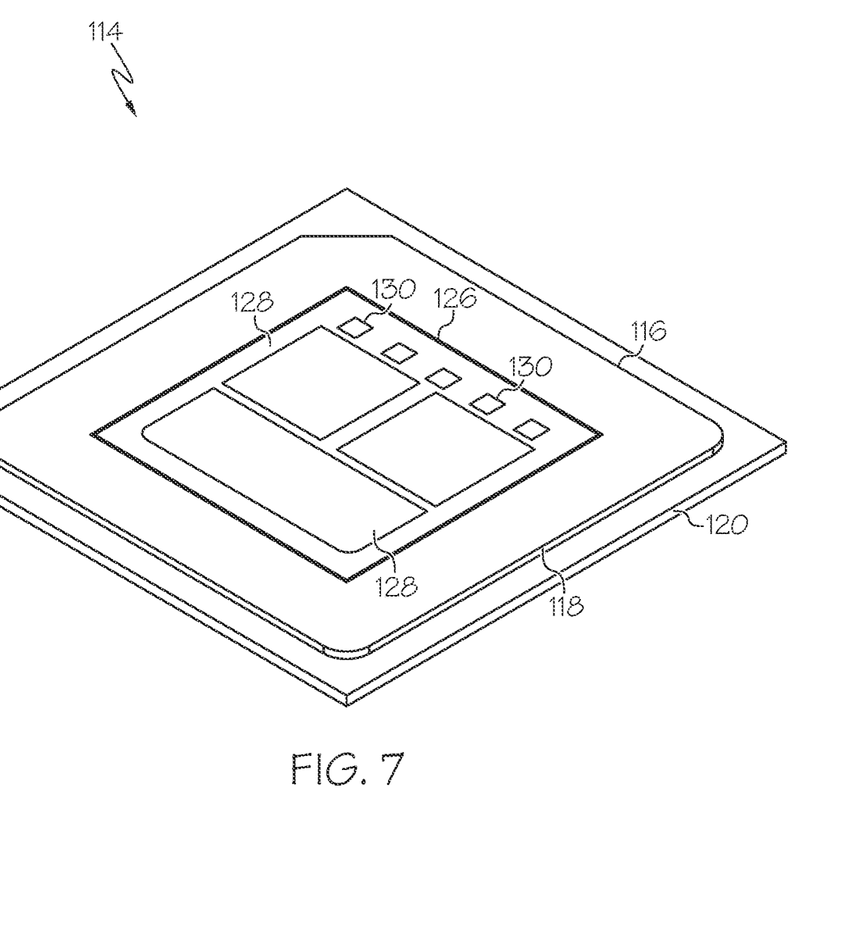
FIG. 7 schematically depicts an assembled, perspective view of one of the plurality of embedded power device assemblies, according to one or more embodiments shown and described herein.

Referring now to FIGS. 6-7, an individual power device assembly 114 of a plurality of power device assemblies 114 for the power electronics assembly 100 is shown. FIG. 6 shows a power device assembly 114 in an exploded view while FIG. 7 shows the power device assembly in an assembled view. The plurality of power device assemblies 114 are embedded (e.g. disposed) into the plurality of substrate cavities 112. As a non-limiting example, the plurality of power device assemblies 114 may define an inverter circuit for powering an electric device, such as an electric motor.

Due to each of the plurality of power device assemblies 114 being positioned in one of the plurality of substrate cavities 112, each of the plurality of power device assemblies 114 is self-aligned relative to the cold-plate assembly 102. In other words, the position of each of the plurality of power device assemblies 114 is known by fixing each of the plurality of power device assemblies 114 to a specified position. This reduces the overall assembly tolerances of the power electronics assembly 100. Additionally, a top surface of each of the plurality of power device assemblies 114 are flush to the first surface 106.

Each power device assembly 114 includes a direct bonded metal (DBM) substrate 116. The DBM substrate 116 provides electrical insulation for the power device assemblies 114 to isolate them from each other.

The DBM substrate 116 includes a first metal layer 118 directly bonded to an electrical insulation layer 120. In an example embodiment, the first metal layer 118 is positioned on the top layer of the DBM substrate 116. The first metal layer 118 may be composed of copper, aluminum, or any suitable conductor. As discussed in greater detail herein, the first metal layer 118 operates as an "S-cell" for the power electronics assembly 100. In other words, the first metal layer 118 provides electrical connection to a bottom electrode of the power device.

The DBM substrate 116 further includes the insulation layer 120. As the cold plate assembly 102 is composed of a conductive material, the insulation layer 120 provides electrical insulation for each of the plurality of power device assemblies 114 from one another. The electrical insulation layer may be a ceramic, such as alumina.

The DBM substrate 116 further includes a power device cavity 122 within the first metal layer 118 of the DBM substrate 116. The DBM substrate 116 further includes a bottom metal layer (not shown) on the bottom surface of the electrical insulation layer 120.

As discussed in greater detail herein, the power device cavity 122 is configured such that after components are bonded to the DBM substrate 116, the top surface of the DBM substrate 116 is flush with the first surface 106.

Each power device assembly 114 further includes a bonding layer 124 (e.g., a solder layer). The bonding layer 124 is positioned on a bottom surface and/or side surfaces of the power device cavity 122 and is configured to bond the power electronics device 126 to the power device cavity 122. The bonding layer 124 may provide bonding by silver sintering, soldering, transient liquid phase bonding (TLP) or any other suitable bonding method.

Each power device assembly 114 further includes the power electronics device 126. The power electronics device 126 may be insulated-gate bipolar transistors (IGBTs), metal-oxide-semiconductor-field-effect-transistors (MOSFETs), or any other suitable power device. The power electronics device 126 is embedded into the power device cavity 122. The power electronics device 126 may be bonded, soldered, adhered to the power device cavity 122 via the bonding layer 124. The power electronics device 126 includes electrical pads 128 to enable power connections for components having high voltage requirements. The power electronics device 126 further includes smaller electrical pads 130 which receives control signals from drivers (e.g., gate drivers) and may provide signals from sensors (e.g., temperature sensors, current sensors,) embedded in the power device assembly 114. The height of the power electronics device 126 and the thickness of the bonding layer 124 are configured such that they are substantially equal to the depth of the power device cavity 122. This results in the top surface of the power device assembly 114 to be flush with the first surface 106.

The power electronics device 126 includes a bottom electrode (not shown) that is that is electrically coupled to the first metal layer 118 through the bonding layer 124. Electrical connection to the bottom electrode is then made through the first metal layer 118. By providing power the device cavity 122 within the first metal layer 118 to electrically couple the first metal layer 118 to the bottom electrode, a separate conductive component is not required to make this electrical connection. This is advantageous as it reduces the number of components, the height, and the overall thermal resistance of the power electronics assembly 100.

Conventional systems, for example, may require insulation layers and grease. These layers increase the overall thermal resistance of the power electronic systems while also separating the heat source from the cold sink. As discussed in FIGS. 6-7, the current arrangement facilitates the removal of layers between the power electronics device 126 (e.g., the heat source) and the heat sink 110. Accordingly, the thermal resistance between the power electronics device 126 and the heat sink 110 is substantially reduced. This is advantageous as it maximizes the cooling of the power electronics devices 126 while creating a compact package size. Additionally, the improved cooling facilitates for the power electronics devices 126 to provide higher power while maintaining a compact package size.

Due to each power electronics device 126 being positioned in one of power device cavities 122, each power electronics device 126 is self-aligned relative to the cold-plate assembly 102. In other words, the position of each power electronics device 126 is known by fixing each power electronics device 126 to a specified position. This reduces the overall assembly tolerances of the power electronics assembly 100.

Additionally, this arrangement facilitates for PCBs to be 3D printed directly upon the first surface 106. This is due to each component of the power electronics assembly 100 being flush relative to the first surface 106 and by having each cavity resulting in the respective component to be self-aligned. Additionally, a bonding reflow fixture is not required in the manufacturing process of the power electronics assembly 100. This is due to there being less components requiring bonding and the improved accuracy of bonding due to the self-alignment features in the power electronics assembly 100.

Figure 8:
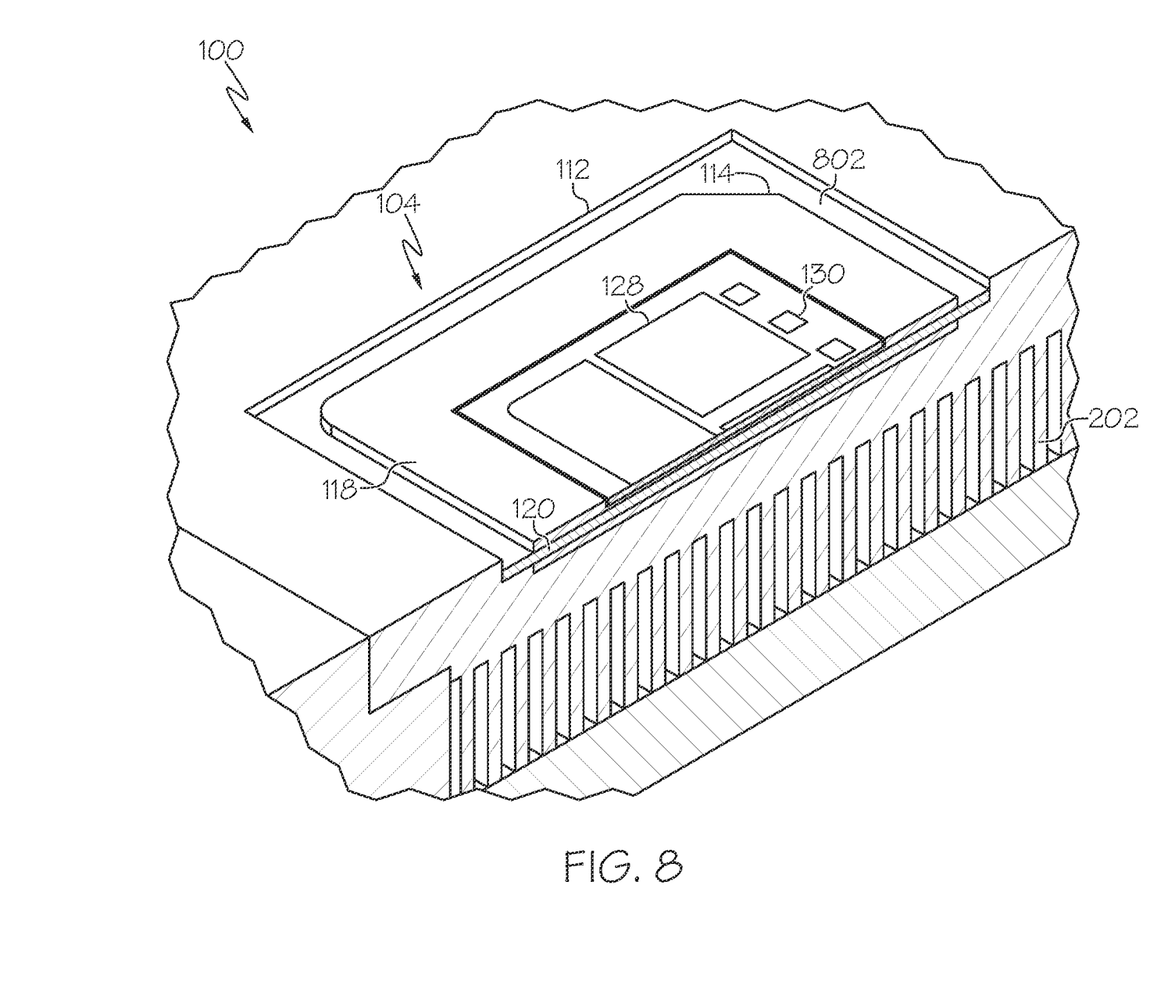
FIG. 8 schematically depicts a perspective view of the power device assembly of FIG. 1, taken along portion B-B of FIG. 5.

Referring now to FIG. 8, a perspective view of the power device assembly of FIG. 1, taken along portion B-B of FIG. 4, is shown. The power device assembly 114 defines a channel 802 (e.g., space, open area) between a perimeter of the power device assembly 114 and the heat sink 110. Before printing a PCB upon the cold plate assembly 102, the channel 802 is may be first filled such that it is flush with the first surface 106. The channel 802 may be filled through a manual filling process or is printed upon by the 3D printer. This is advantageous as it allows the first surface 106 to be flush throughout the entire top surface of the cold plate assembly 102. FIG. 8 also illustrates the channel-like structure of the fins 202. As discussed in greater detail above, coolant that has entered the manifold 104 flows through these channels in order to increase cooling.

Figure 9:
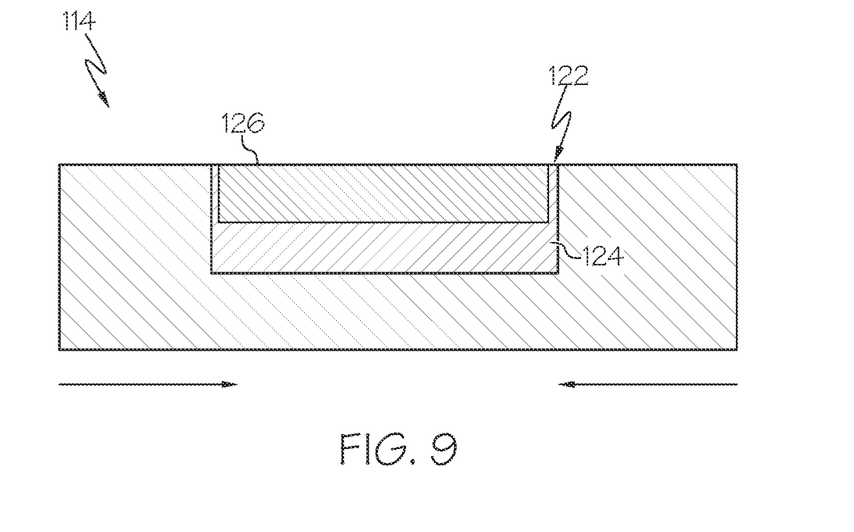
FIG. 9 schematically depicts a side view of a power device assembly embedded into a power device assembly, according to one or more embodiments shown and described.
Figure 10:
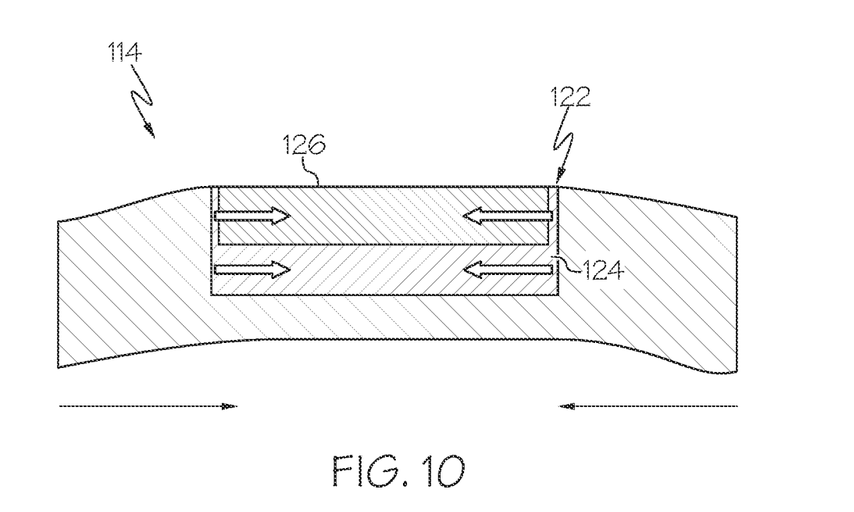
FIG. 10 schematically depicts a side view of a power device assembly embedded into a power device assembly in response to receiving a force according to one or more embodiments shown and described herein.

Referring now to FIGS. 9-10, a side view of a power device assembly 114 embedded into the power device cavity 122 is shown. As illustrated in FIG. 6, the power electronics device 126 is positioned beneath the top surface of the power device cavity 122. This is advantageous as it provides additional surface area between the power electronics device 126 and the bonding layer 124. This results in superior bonding between the power electronics device 126 and the bonding layer 124.

Due to materials having varying coefficients of thermal expansion (CTE), during cooling a force may be applied onto the bonding layer 124 and the power electronics device 126. In conventional systems, where the bonding layer 124 and the power electronics device 126 are positioned above the first surface 106, the force on the bonding layer 124 and the power electronics device 126 is a splitting force (e.g., the bonding layer 124 and the power electronics device 126 are pushed away from each other tangential to the first surface 106). This is a concern as the bonding layer 124 and the power electronics device 126 may not be able to handle strong splitting forces. This can cause the power electronics device 126 to separate from the bonding layer 124.

As illustrated in FIG. 10, in response to undergoing the force, the bonding layer 124 and the power electronics device 126 experience a compression force. This is advantageous as the bonding layer 124 and the power electronics device 126 are much less likely to separate due to a compression force in comparison to a splitting force. This improves the reliability of the power electronics assembly 100 in production and during operation.

Figure 11:
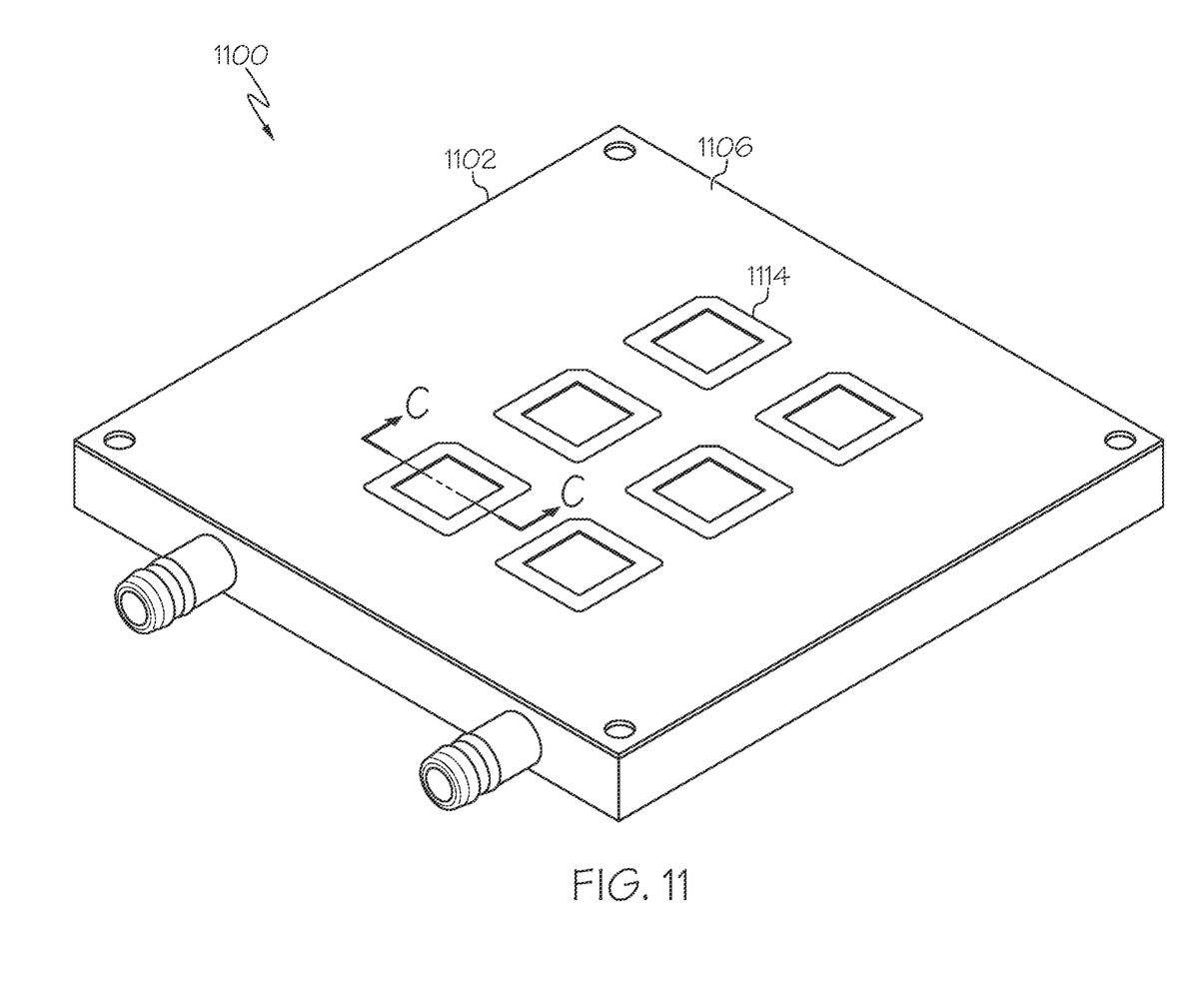
FIG. 11 schematically depicts another perspective view of an illustrative power electronics assembly including a plurality of embedded power device assemblies, according to one or more embodiments shown and described herein.

Referring now to FIG. 11, a perspective view of another power electronics assembly 1100 is shown, according to another embodiment. As illustrated, each channel (e.g., such as channel 802) between a perimeter of a power device assembly 1114 (e.g., such as power device assembly 114) and a heat sink 1110 (e.g., such as the heat sink 110) is filled such that it is flush with a first surface 110 of a cold plate assembly 1102 (e.g., such as cold plate assembly 102). In order for a PCB to be printed upon the first surface 1106, the first surface 1106 should be substantially flat. A substantially flat surface allows for the PCB to have superior electrical connections to power electronic devices and removes the need for a reflow process. As discussed in greater detail above, the power electronics assembly 1100 is configured for its components to be substantially flat with the first surface. This is advantageous as it reduces a step to make the first surface 1106 (e.g., manual or automated filling) to become flat.

Figure 12:
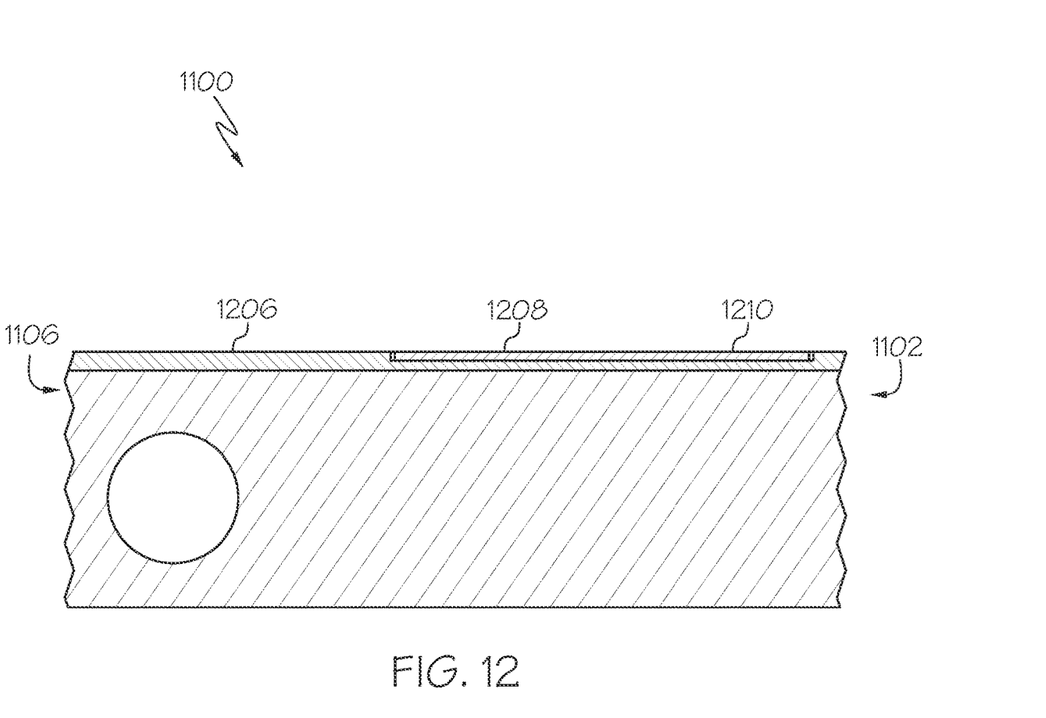
FIG. 12 schematically depicts a side view of the power electronics assembly of FIG. 11, taken along cross-section C-C of FIG. 11.

Referring now to FIG. 12, a side view of the power electronics assembly 1100 of FIG. 11, taken along cross-section C-C, is shown according to another embodiment. The power electronics assembly 1100 includes an insulation layer 1206 (e.g., such as the insulation layer 120) that is 3D printed upon the first surface 1106. The insulation layer 1206 may be ceramic or any other suitable electrically insulating material. During the printing of the insulation layer 1206, a substrate cavity 1208 (e.g., such as the substrate cavity 112) is formed on a top surface of the insulation layer 1206.

The power electronics assembly 1200 further includes a metal layer 1210 (e.g., such as the metal substrate 118) that is 3D printed within the substrate cavity 1208. The metal layer 1210 may be copper, aluminum or any other suitable electrically conducting material. After the metal layer 1210 is printed, power devices may be sintered, soldered, or adhered to the metal layer 1210. This is advantageous as it reduces the number of manufacturing steps to create the power electronics assembly 1100. Additionally, due to the insulation layer 1206 printed directly on the first surface 1106, a DBM substrate (e.g., such as the DBM substrate 116) is no longer required.

Figure 13:
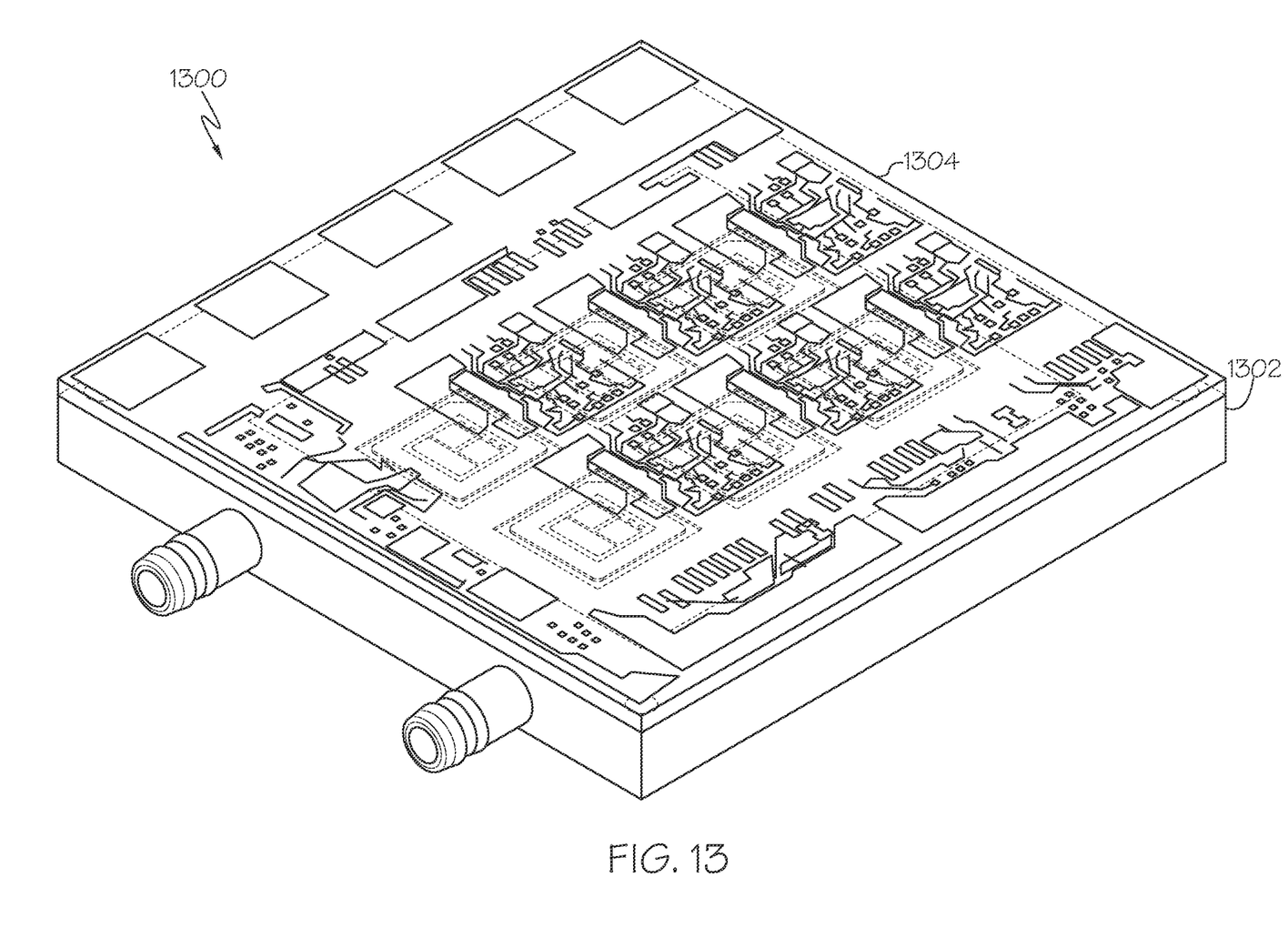
FIG. 13 schematically depicts a perspective view of an illustrative power electronics assembly having a PCB printed upon it, according to one or more embodiments shown and described herein.

Referring now to FIG. 13, a perspective view of a power electronics assembly 1300 is shown, according to another embodiment. The power electronics assembly 1300 includes a cold plate assembly 1302 (e.g., such as cold plate assembly 102 and cold plate 1202). Printed upon the cold plate assembly 1302 is one or more PCBs 1304. The one or more PCBs 1304 are electrically coupled to a plurality of embedded power devices positioned in the cold plate 1202 and are configured to receive power from the plurality of embedded power devices. Additionally, as a result of the plurality of embedded power devices being positioned within the cold plate assembly 1302, the power electronics assembly 1300 has superior cooling due to there being less total thermal resistance and a decreased distance between the cold plate assembly 1302 and the plurality of embedded power devices.

In some embodiment, the entire power electronics assembly 1300 is 3D printed. Due to the self-alignment of heat sink cavities (e.g., such as heat sink cavity 108), substrate cavities (e.g., such as substrate cavities 112), and power device cavities (e.g., such as power device cavity 122), each component has a respective reference point. This results in lower assembly tolerances through the entire assembly. Accordingly, this facilitates the entire power electronics assembly 1300 to be 3D printed as there is less variability in the system.

From the above, it is to be appreciated that defined herein are embodiments directed to power electronics assemblies having DBM layers integrated with conductive layers and cold plate assemblies having self-alignment features. This facilitates for PCBs to be printed upon the cold plate assembly resulting in less overall thermal resistance and improved cooling.

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

It will be apparent to those skilled in the art that various modifications and variations can be made to the embodiments described herein without departing from the scope of the claimed subject matter. Thus, it is intended that the specification cover the modifications and variations of the various embodiments described herein provided such modification and variations come within the scope of the appended claims and their equivalents.

What is claimed:

1. A power electronics assembly comprising:
   a cold plate assembly comprising:
      a manifold comprising a heat sink cavity in a first surface; and
      a heat sink comprising one or more substrate cavities, wherein the heat sink is disposed in the heat sink cavity; and
   one or more power device assemblies disposed within the one or more substrate cavities, each power device assembly of the one or more power device assemblies comprising:

a direct bonded metal (DBM) substrate comprising a first metal layer directly bonded to an insulator layer, the DBM substrate comprising a power device cavity; and a power device disposed in the power device cavity, the power device being electrically coupled to the first metal layer.

2. The power electronics assembly of claim 1, further comprising a bonding layer disposed at least partially between the power device cavity and the power device, the bonding layer defining a bonding height, wherein:
the substrate cavity defines a substrate cavity depth,
the power device defines a power device height, and
the substrate cavity depth is substantially equal in value to the power device height with the bonding height.

3. The power electronics assembly of claim 1, wherein the power device cavity is shaped and sized to receive the power device.

4. The power electronics assembly of claim 1, wherein a top surface of the first metal layer is substantially on a same plane as a top surface of the power device.

5. The power electronics assembly of claim 1, wherein:
the first surface is substantially on a same plane as a top surface of the power device,
the first metal layer and the power device define a channel extending around a perimeter of the power device;
the cold plate assembly is configured for the channel to be printed upon until a top surface of the channel is on the same plane as the first surface; and
the cold plate assembly is configured for a printed circuit board (PCB) substrate to be printed upon the first surface.

6. The power electronics assembly of claim 1, wherein the cold plate assembly is configured for an electrical insulation layer and an s-cell to be printed upon the first surface.

7. The power electronics assembly of claim 1, further comprising:
an inlet of the manifold configured to receive coolant;
an outlet of the manifold configured to provide coolant, the outlet being fluidly coupled to the inlet; and
a fin disposed between the inlet and the outlet, the fin further disposed fluidly downstream of the inlet, the fin being configured to disrupt flow of the coolant downstream of the inlet.

8. A power device assembly comprising:
a direct bonded metal (DBM) substrate comprising a first metal layer directly bonded to an insulator layer, the DBM substrate comprising one or more power device cavities; and
one or more power devices each disposed in one of the one or more power device cavities, each of the one or more power devices being electrically coupled to the first metal layer.

9. The power device assembly of claim 8, further comprising a first surface of a heat sink assembly, wherein the DBM substrate is disposed in a heat sink cavity on the first surface.

10. The power device assembly of claim 9, wherein the first surface is substantially on a same plane as a top surface of the power device.

11. The power device assembly of claim 10, wherein the heat sink assembly is configured for the insulator layer and an s-cell to be printed upon the first surface.

12. The power device assembly of claim 10, wherein the first metal layer and each of the one or more power devices define a channel extending around a perimeter each of the power devices, and wherein the channel is printed upon until a top surface of the channel is substantially on the same plane as the first surface.

13. The power device assembly of claim 8, wherein each of the power device cavities is shaped and sized to receive a power device of the one or more power devices.

14. The power device assembly of claim 8, wherein a top surface of the first metal layer is substantially in a same plane as a top surface of the power device.

15. A method of forming a power electronics assembly, the method comprising:
positioning a heat sink into a heat sink cavity on a first surface of a cold plate manifold, the heat sink comprising one or more substrate cavities;
embedding one or more power device assemblies within the one or more substrate cavities, each power device assembly comprising a direct bonded metal (DBM) substrate comprising a first metal layer bonded to an insulator layer, the DBM substrate comprising a power device cavity;
placing a bonding layer at least partially within the power device cavity; and
bonding a power device to the power device cavity via the bonding layer, the power device being electrically coupled to the first metal layer.

16. The method of claim 15, wherein:
the bonding layer defines a bonding height,
the power device cavity defines a power device cavity depth,
the power device defines a power device height, and
the power device cavity depth is substantially equal in value to the power device height with the bonding height.

17. The method of claim 15, wherein the power device cavity is shaped and sized to receive the power device.

18. The method of claim 15, further comprising printing a printed circuit board (PCB) substrate onto the first surface, wherein a top surface of the first metal layer is substantially on a same plane as a top surface of the power device.

19. The method of claim 15, further comprising printing the insulator layer and an s-cell onto the first surface, wherein a top surface of the first metal layer is substantially on a same plane as a top surface of the power device.

20. The method of claim 15, further comprising:
receiving coolant via an inlet of the cold plate manifold;
providing coolant via an outlet of the cold plate manifold, the outlet being fluidly coupled to the inlet; and
disrupting coolant flow downstream of the inlet via a fin, the fin disposed between the inlet and the outlet and the fin further disposed fluidly downstream of the inlet.

* * * * *